United States Patent
Yang

(10) Patent No.: US 8,035,228 B2
(45) Date of Patent: Oct. 11, 2011

(54) HIGH-DENSITY 3-DIMENSIONAL RESISTORS

(75) Inventor: Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/367,951

(22) Filed: Feb. 9, 2009

(65) Prior Publication Data

US 2009/0140387 A1    Jun. 4, 2009

Related U.S. Application Data

(63) Continuation of application No. 11/538,199, filed on Oct. 3, 2006, now Pat. No. 7,488,682.

(51) Int. Cl.
*H01L 23/48* (2006.01)
*H01L 23/52* (2006.01)
*H01L 29/40* (2006.01)
*H01L 21/44* (2006.01)

(52) U.S. Cl. ......... 257/758; 257/E21.004; 257/E23.015; 438/601

(58) Field of Classification Search .................. 257/758, 257/E21.004, E23.015; 438/601
See application file for complete search history.

(56) References Cited

U.S. PATENT DOCUMENTS

| | | | |
|---|---|---|---|
| 5,485,138 A | 1/1996 | Morris | |
| 6,083,785 A | 7/2000 | Segawa et al. | |
| 6,207,560 B1* | 3/2001 | Lee | 438/656 |
| 6,232,042 B1 | 5/2001 | Dunn et al. | |
| 7,122,898 B1* | 10/2006 | Yang et al. | 257/751 |
| 7,314,786 B1* | 1/2008 | Yang et al. | 438/171 |
| 7,737,020 B1* | 6/2010 | Ho et al. | 438/619 |
| 2003/0116820 A1* | 6/2003 | Daubenspeck et al. | 257/529 |
| 2004/0027234 A1 | 2/2004 | Hashimoto et al. | |
| 2006/0012052 A1 | 1/2006 | McDevitt et al. | |
| 2006/0057835 A1* | 3/2006 | Anderson et al. | 438/619 |
| 2006/0088947 A1* | 4/2006 | Lien et al. | 438/3 |
| 2006/0163730 A1 | 7/2006 | Matsumoto | |
| 2006/0192286 A1 | 8/2006 | Kanamura | |
| 2006/0249846 A1* | 11/2006 | Yang et al. | 257/751 |
| 2006/0267144 A1* | 11/2006 | Aitken et al. | 257/536 |
| 2007/0013073 A1* | 1/2007 | Cabral et al. | 257/758 |
| 2007/0040239 A1* | 2/2007 | Chinthakindi et al. | 257/536 |
| 2007/0040276 A1 | 2/2007 | Yang et al. | |
| 2007/0046421 A1* | 3/2007 | Gogineni et al. | 338/309 |
| 2007/0181974 A1* | 8/2007 | Coolbaugh et al. | 257/536 |

* cited by examiner

*Primary Examiner* — Kiesha Bryant
*Assistant Examiner* — Igwe U Anya
(74) *Attorney, Agent, or Firm* — Scully, Scott, Murphy & Presser, P.C.; Ian D. MacKinnon, Esq.

(57) ABSTRACT

Interconnect, i.e., BEOL structures comprising at least one thin film resistor that is located at the same level as that of a neighboring conductive interconnect are provided. The present invention also provides a method of fabricating such interconnect structures utilizing processing steps that are compatible with current interconnect processing. Moreover, the inventive method of the present invention provides better technology extendibility in terms of higher density than prior art schemes.

18 Claims, 7 Drawing Sheets

HIGH-DENSITY 3-DIMENSIONAL RESISTORS

RELATED APPLICATION

This application is a continuation of U.S. patent application Ser. No. 11/538,199, filed Oct. 3, 2006, now U.S. Pat. No. 7,488,682.

FIELD OF THE INVENTION

The present invention relates to a semiconductor structure and a method of fabricating the same. More particularly, the present invention relates to an interconnect structure which includes at least one high-density three-dimensional (3D) resistor that is located at the same interconnect level as that of a neighboring conductive interconnect. The present invention also provides a method of fabricating such an interconnect structure.

BACKGROUND OF THE INVENTION

In semiconductor devices, it is well known to have thin film (on the order of about 500 μm or less) resistors embedded in the back-end-of-the-line (BEOL) of the chip through either a damascene approach or a subtractive etch method. The BEOL thin film resistors are preferred over other types of resistors because of lower parasitics. However, the sheet resistivity or the various resistors formed over the entire wafer may vary and go beyond specifications due to poor process control. In an advanced manufacturing line, wafers out of specification are often scrapped for quality control.

The resistor is one of the most common electrical components used in almost every electrical device. Conventionally, doped polysilicon is used as the material of a resistor. However, the conventional resistor can only provide a limited resistance within a limited dimension as the device feature size shrinks. For overcoming this problem, new materials with higher resistivity and new integration schemes are required for fabrication of thin film resistors in a highly integrated semiconductor device.

Resistive thin films such as CrSi and TaN are often used as resistors in semiconductor devices. Integration schemes used to fabricate the resistor components within the interconnect structure falls into two primarily categories.

In a first integration scheme, which is disclosed, for example, in U.S. Pat. No. 6,207,560, a thin film resistor is formed by etching on top of an insulator. A metallic layer is then deposited on top of the resistive layer and is used to protect the resistive layer from being damaged during the sequential etching process. After the resistor has been defined, the underlying dielectric is patterned and etched to define the interconnect pattern. Finally, a metallic layer for the interconnect is deposited, patterned, and etched. Although the protective layer is capable of protecting the resistive layer, the protection is limited and the resistive layer may be damaged during the etching process.

In a second integration scheme, a thin film resistor is formed by etching on top of an insulator. An interlevel dielectric is then deposited, followed by patterning and etching processes to define an upper level interconnect structure with vias connected to the underlying thin film resistor. A planization process is typically required after deposition of the interlevel dielectric material in order to compromise any possible topography related issues caused by the underlying resistors.

U.S. Patent Application Publication No. 2004/0027234 discloses a resistor including upper surface electrodes formed on a main surface of a substrate and side face electrodes disposed on side faces of the substrate and connected electrically to the pair of upper surfaces electrodes, respectively.

U.S. Pat. No. 6,232,042 discloses a method for fabricating an integral thin film metal resistor that generally entails applying a photosensitive dielectric to a substrate to form a layer. The dielectric layer is photoimaged to polymerize a first portion of the dielectric layer on the first region of the substrate, leaving the reminder of the dielectric layer unpolymerized. An electrically resistive film is then applied to the dielectric layer, and the dielectric layer is developed to remove concurrently the unpolymerized portion thereof and the portion of the resistive film overlaying the unpolymerized portion, so that a portion of the resistive film remains over the second portion to form the resistor.

U.S. Pat. No. 6,083,785 discloses a method of fabricating a semiconductor device having a resistor film. This prior art method includes forming an isolation region in a part of a P-well of a semiconductor substrate. A resistor film as a first conductor member is formed on the isolation region. By utilizing a salicide process, a resistor can be formed without lowering the resistance of the resistor film.

U.S. Pat. No. 5,485,138 discloses an inverted thin film resistor structure comprising a metallic interconnect layer having predetermined patterns delineating two or more metallic leads overlaying a supporting insulator, an interlevel dielectric layer, and planarized so as to expose a top contact portion of the metallic interconnect leads, and an inverted thin film resistor overlaying a portion of the planarized interlevel dielectric layer and overlaying the exposed top contact portions of the interconnect leads.

Prior art resistors can be trimmed by using laser or high-energy particle beam. But, these processes are not clean and therefore have never become a common practice. Resistor can also be programmed by using a shut transistor to deselect at least a portion of the resistor from a chain of the resistor circuit. Such a programming method has two problems, the resolution of the programming is limited by the LSB (least significant bit) device size, and the shut device itself has some resistance. Tuning precision is thus poor.

In view of the above, there is still a need for providing interconnect structures having at least one thin film resistor that is located at the same interconnect level as a neighboring conductive interconnect as well as a method of fabricating such an interconnect structure. The term "conductive interconnect" is used in the present application to denote either a conductive line or conductive via/line combination.

SUMMARY OF THE INVENTION

The present invention provides interconnect, i.e., BEOL, structures comprising at least one thin film resistor that is located at the same interconnect level as that of a neighboring conductive interconnect. The present invention also provides a method of fabricating such interconnect structures utilizing processing steps that are compatible with current interconnect processing. Moreover, the inventive method provides better technology extendibility in terms of higher density than prior art schemes. By "higher density" it is meant less layout area is sufficient for fabricating a 3D resistor as compared to a conventional 2D resistor with a comparable value of resistance. In accordance with the present invention, the 3D resistors are located inside lithographically defined features (i.e., lines and via/line structures) lining the walls of the particular feature.

In general terms, the present invention discloses a method of adopting the high resistivity of metallic materials, e.g., diffusion barrier materials, inside lithographically defined features as an element of an electrical resistor for chip applications. 3-D resistors are provided in the present invention that have a higher electrical resistance as compared to conventional 2-D resistors. Moreover, the method of the present invention permits the modulation of the resulting electrical resistance by controlling the process conditions employed in fabricating the resistor.

The following advantages can be obtained by utilizing the method of the present invention:
 No etching stop material is required to be located over the thin film resistor areas,
 The thin film resistors can be photographically defined and etched rather than be defined by lift-off,
 Resistance of the structure is determined by patterned feature sizes, i.e., length, width and depth, which offers a feature of better resistor control,
 The process is compatible with current BEOL process flow.

In general terms, the interconnect structure of the present application comprises a dielectric material including a conductive interconnect located within an interconnect area of said dielectric material and a resistor located along wall portions of a lithographically defined feature within a resistor area of said dielectric material, wherein said resistor is located at the same interconnect level as that of the conductive interconnect.

In one embodiment of the present invention, an interconnect structure is provided that comprises, from bottom to top:
 a first interconnect level including a first conductive interconnect embedded within a first dielectric material;
 a second interconnect level comprising a second dielectric material including a conductive interconnect located within an interconnect area of said second dielectric material and a resistor located along wall portions of a lithographically defined feature within a resistor area of said second dielectric material, wherein said resistor is located at the same interconnect level as that of the conductive interconnect; and
 a third interconnect level including a third conductive interconnect embedded within a third dielectric material, wherein portions of the third dielectric are at least partially present within said lithographically defined feature of said resistor area.

In addition to the interconnect structure generally described above, the present invention also includes a method of fabricating such an interconnect structure that comprises:
 providing an interconnect structure that comprises a lower dielectric material having at least one conductive interconnect located within an interconnect area of said lower dielectric material and at least one other conductive interconnect located within a lithographically defined feature within a resistor area of said lower dielectric material;
 selectively removing at least some of the at least one other conductive interconnect from said resistor area, while leaving a diffusion barrier material on wall portions of said lithographically defined feature within said resistor area, said diffusion barrier material forming a resistive element;
 depositing an upper dielectric material on said lower dielectric material in both said interconnect area and said resistor area, said upper dielectric material fills said lithographically defined feature within said resistor area; and
 forming an upper conductive interconnect in said upper dielectric material in both said interconnect area and said resistor area.

DETAILED DESCRIPTION OF THE INVENTION

The present invention, which provides an interconnect structure with high density 3-D thin film resistors at the same interconnect level as a neighboring conductive interconnect, and a method of fabricating the same, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above the present invention provides interconnect, i.e., BEOL, structures comprising at least one thin film resistor that is located at the same interconnect level as that of a neighboring conductive interconnect. In accordance with the present invention, the resistor is located inside a lithographically defined feature (i.e., line and via/line structure) lining the walls of the particular interconnect feature. The present invention also provides a method of fabricating such an interconnect structure utilizing processing steps that are compatible with current interconnect processing. Moreover, the inventive method of the present invention provides better technology extendibility in terms of higher density than prior art schemes.

Reference is now made to FIGS. 1A-1E, which are pictorial representations (through cross sectional views) depicting the basic processing steps employed in one embodiment of the present invention. Specifically, the inventive method begins with providing the interconnect structure 10 shown in FIG. 1A. The interconnect structure 10 shown in FIG. 1A comprising a first interconnect level 12 and a second interconnect level 22 that are separated in part by a dielectric capping layer 20.

Figure 1A:
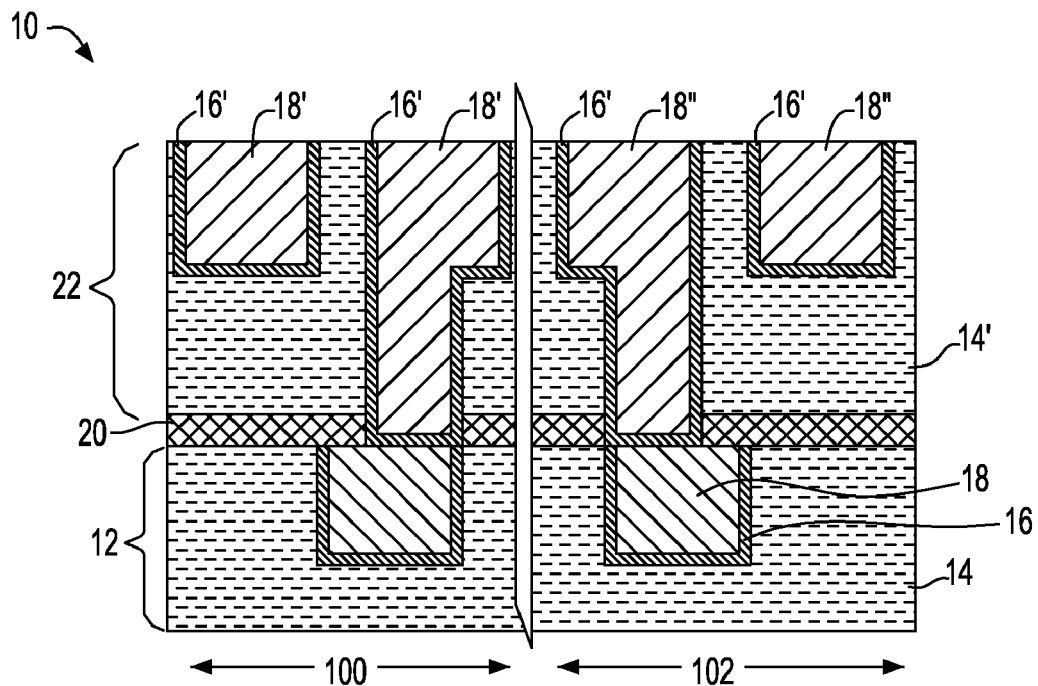
FIGS. 1A-1E are pictorial representations (through cross sectional views) depicting the basic processing steps employed in one embodiment of the present invention.

The first interconnect level 12, which may be located above a semiconductor substrate including one or more semiconductor devices, comprises a first dielectric material 14 having at least one conductive interconnect 18 that is separated from the first dielectric material 14 by a diffusion barrier 16. The second interconnect level 22 comprises a second dielectric material 14' having conductive interconnects 18' located within lithographically defined features (not specifically labeled) of interconnect area 100 and conductive interconnects 18" located within lithographically defined features (not specifically labeled) of resistor area 102. The lithographically defined features may comprises single damascene lines, dual damascene lines and underlying dual damascene vias, or any combination thereof, as is shown in FIG. 1A. Although such an embodiment is shown and described, the present invention works well for structures including single damascene lines or dual damascene lines and vias.

In accordance with the present invention, each of the conductive interconnects 18' and 18" within the second dielectric material 14' are separated from the dielectric material by a diffusion barrier 16'.

The interconnect structure 10 shown in FIG. 1A is fabricated utilizing standard back-end-of-the-line (BEOL) processes that are well known in the art including a single damascene or dual damascene process. A first via then line opening process may be used, or a first line then via opening process may be used.

The process typically includes deposition, lithography, etching and filling of an opening with a diffusion barrier and then a conductive material, and thereafter planarization. Inasmuch as the processing details for fabricating such an interconnect structure are well known to those skilled in the art, the details are omitted herein to avoid obscuring of the current invention.

It is noted that the first interconnect level 12 of the interconnect structure 10 may be formed atop a substrate (not shown in the drawings of the present application). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The first dielectric material 14 and the second dielectric material 14', which may be the same or different material, comprise any interlevel or intralevel dielectric including inorganic dielectrics or organic dielectrics. The first and second dielectric materials 14 and 14' respectively, may be porous or non-porous. Some examples of suitable dielectrics that can be used as the first and second dielectric materials include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first and second dielectric materials 14 and 14', respectively, typically have a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric materials may vary depending upon the dielectric material used as well as the exact number of dielectrics layers within the first and second dielectric materials. Typically, and for normal interconnect structures, the first dielectric material 14 and second dielectric material 14' each have a thickness from about 50 to about 1000 nm.

The diffusion barriers 16 and 16', which may be the same or different materials, comprise Ta, TaN, Ti, TiN, Ru, RuN, RuTa, RuTaN, W, WN or any other material that can serve as a barrier to prevent conductive material from diffusing there through. The thickness of the diffusion barriers 16 and 16' may vary depending on the deposition process used as well as the material employed. Typically, the diffusion barriers 16 and 16' have a thickness from about 4 to about 40 nm, with a thickness from about 7 to about 20 nm being more typical.

The conductive material used in forming the conductive interconnects 18, 18' and 18" in each of the interconnect levels includes, for example, polySi, a conductive metal, an alloy comprising at least one conductive metal, a conductive metal silicide or combinations thereof. Preferably, the conductive material that is used in forming the conductive interconnects 18, 18' and 18" is a conductive metal such as Cu, W or Al, with Cu or a Cu alloy (such as AlCu) being highly preferred in the present invention.

The dielectric capping layer 20 which separates, at least in part, the second interconnect level 22 from the first interconnect level 12 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 20 may vary depending on the technique used to form the same as well as the material make-up of the layer. Typically, the dielectric capping layer 20 has a thickness from about 15 to about 100 nm, with a thickness from about 25 to about 45 nm being more typical.

It is again noted that the interconnect structure 10 includes at least one interconnect area 100, and at least one resistor area 102. The at least one interconnect area 100 is a region of the structure in which conductive interconnects will be present; the conductive interconnects in the various interconnect levels are stacked on top of one another. The at least one resistor area 102 is a region of the structure in which at least one thin film resistor will be formed.

Figure 1B:
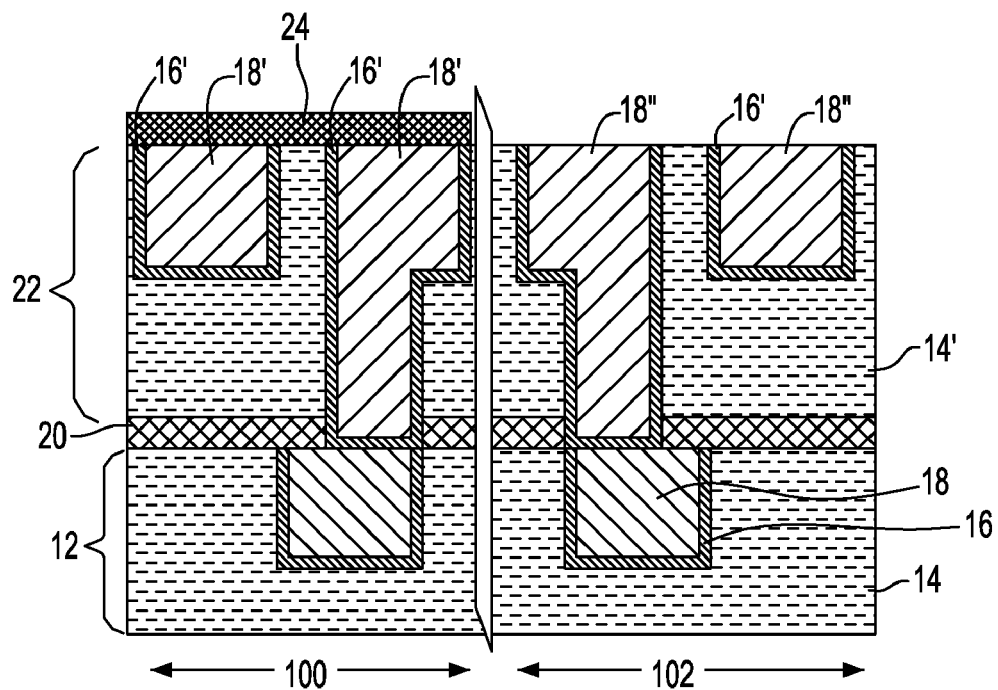

FIG. 1B illustrates the structure that is provided after forming a protective cap 24 atop the second interconnect level 22 in the interconnect area 100. As is illustrated, the protective cap 24 covers the second dielectric material 14' and the conductive interconnects 18' that are located in the interconnect area 100, while leaving the conductive interconnects 18" in the resistor area 102 exposed.

The protective cap 24 is comprised of a dielectric material including, for example, $Si_3N_4$, SiC, SiC(N,H), and multilayers thereof. The protective cap 24 is formed by first depositing a blanket layer of protective cap material across the entire surface of the second interconnect level 22. Any conventional deposition process can be used for the blanket deposition including, for example, chemical vapor deposition, plasma enhanced chemical vapor deposition, atomic layer deposition, evaporation, chemical solution deposition, and spin-on coating. Following the blanket deposition of the protective cap material, the layer of protective cap material is patterned by lithography and etching. The lithographic step comprises forming a photoresist atop the blanket layer of protective cap material, exposing the photoresist to a desired pattern of radiation and developing the exposed photoresist utilizing a conventional resist developer. The etching step used to pattern the blanket layer of protective cap material comprises a wet etching process, or more preferably, a dry etching process such as, for example, reactive ion etching is used.

The thickness of the protective cap 24 that is formed may vary depending on the protective cap material employed and the deposition process that was used in forming the same. Typically, the thickness of the protective cap 24 that covers the interconnect area 100 of the second interconnect level 22 has a thickness from about 15 to about 100 nm, with a thickness from about 25 to about 45 nm being even more typical.

Figure 1C:
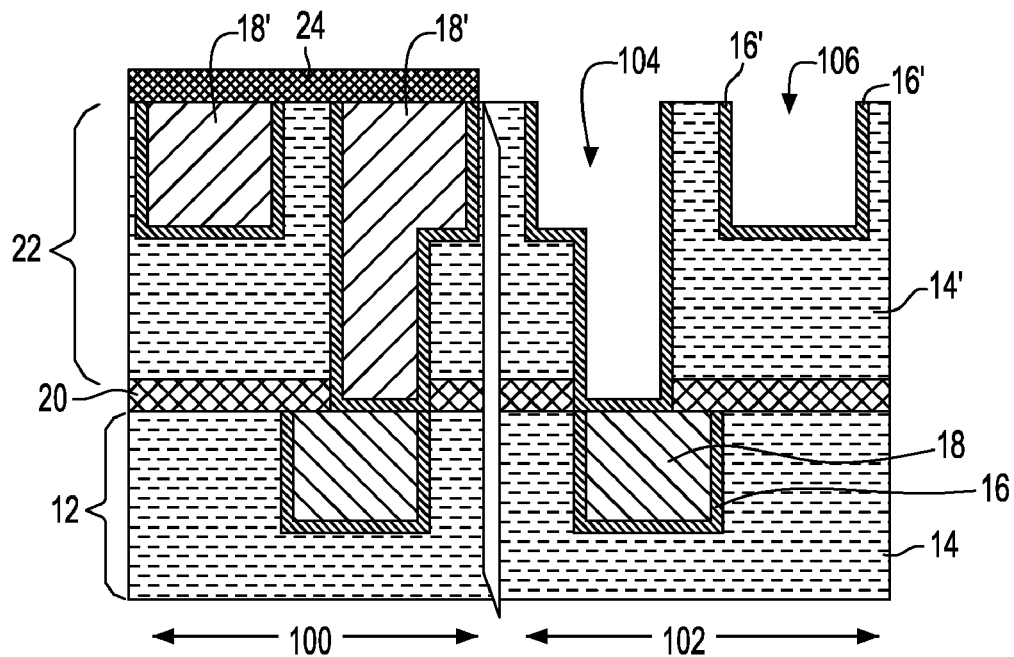

After forming the protective cap 24 shown in FIG. 1B, the conductive material is in accordance with this embodiment of the present invention, completely removed from the conductive interconnects 18" in the resistor area 102 utilizing an etching process that is selective for removing conductive material. When the conductive material is Cu, a combination of acids, such as, for example, HF, $H_2SO_4$, HCl and $HNO_3$ may be used. As is shown in FIG. 1C, the diffusion barrier 16' in the resistor area 102 is exposed after the removal of the conductive interconnects 18" from that area of the structure. In accordance with the present invention, this diffusion barrier 16' within the resistor area 102 serves as the resistive element in the present application. Note that the resistive element, e.g., diffusion barrier 16', within the resistor area 102 lies wall portions of interconnect features 104 (via/line structure) and 106 (line structure), respectively After removing the conductive interconnects 18" from the lithographically defined features in the exposed resistor area 102, a third dielectric material 14" is formed in both the interconnect area 100 and the resistor area 102 providing the structure shown, for example, in FIG. 1D. The third dielectric material 14" may comprise one of the above-mentioned dielectric materials for the first and second dielectric materials. The third dielectric material 14", which represents the dielectric material of the next interconnect level, is formed utilizing one of the techniques mentioned above in forming the first and second dielectric materials. The thickness of the third dielectric material 14" may vary and is not critical to the present application. It is noted that the third dielectric material 14" in the resistor area 102 completely fills the interconnect features within the resistor area 102.

Figure 1D:
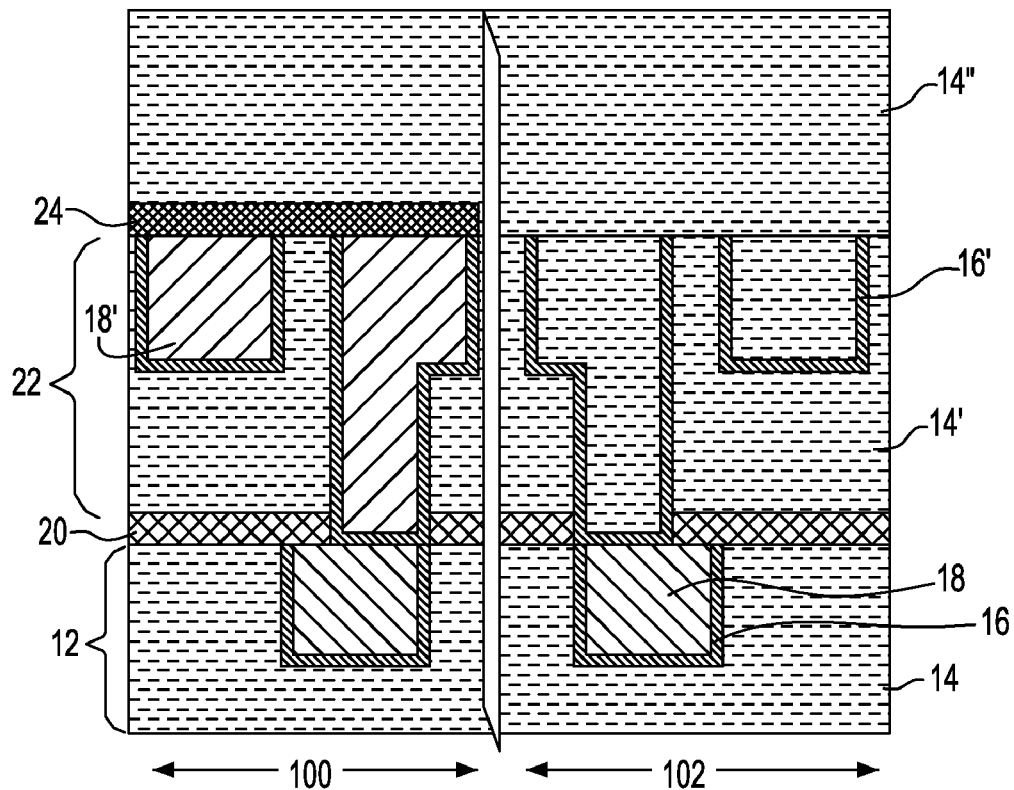
Figure 1E:
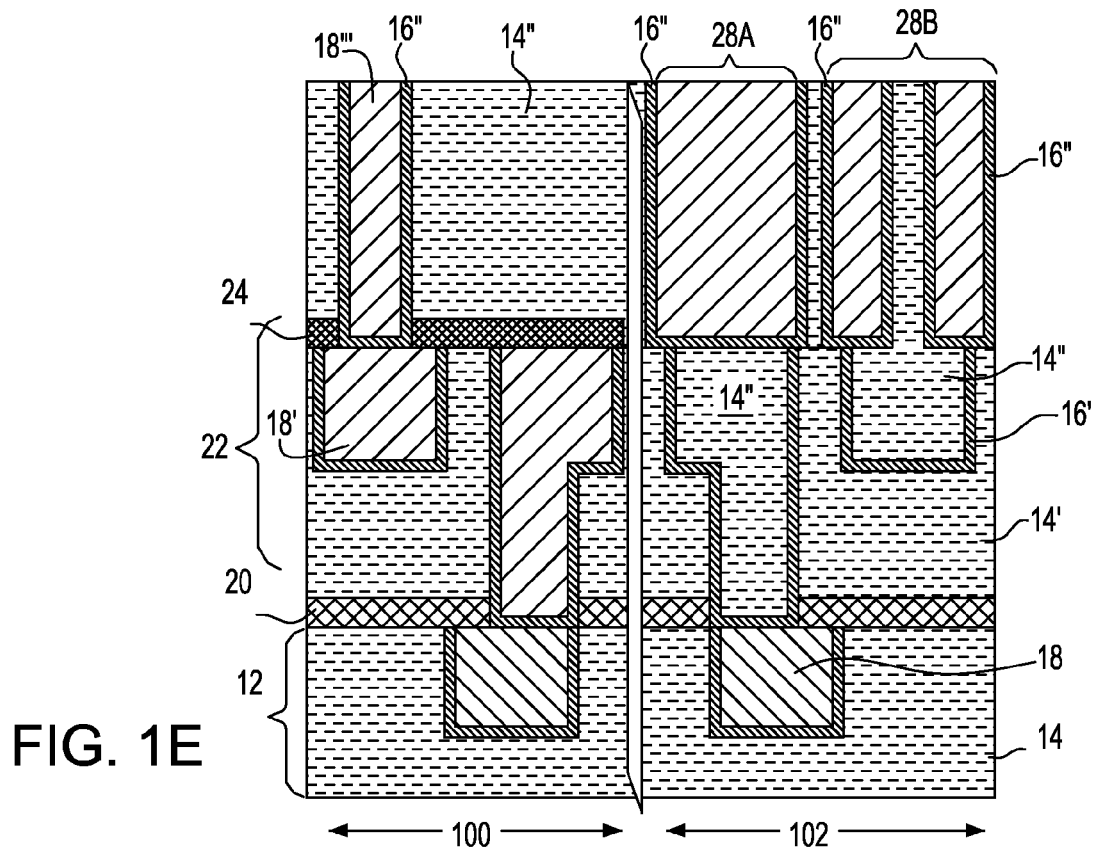

After providing the structure shown in FIG. 1D, lithography and etching are used to form openings in third dielectric material 14" in both the interconnect area 100 and the resistor area 102. The openings in the interconnect area 100 extends through the third dielectric material 14" and the protective cap 24, stopping on the conductive interconnect 18' of the second interconnect level 22. The openings in the resistor area 102 extend down through the third dielectric material 14" stopping atop the now dielectrically filled features in the resistor area 102 of the structure. After providing these openings, the openings are lined with a diffusion barrier 16" and filled with another conductive material. The diffusion barrier 16" may comprise one of the above-mentioned materials for diffusion barriers 16 and 16'. The conductive material may also comprise one of the above mentioned conductors mentioned for conductive interconnects 18, 18' and 18". The conductively filled region in the interconnect area 100 and the resistor area 102 forms other conductive interconnect 18'" of the interconnect structure. The resultant structure that is formed is shown, for example, in FIG. 1E. It is noted the conductive interconnect 18" in the resistor area completes the resistor circuit. Two resistor circuits 28A and 28B are shown in the drawings by way of example. Although both resistor circuits are shown, the present invention contemplates embodiments wherein either resistor circuit 28A is formed or resistor circuit 28B is formed.

As is shown, the resistors (i.e., diffusion barrier 16') within the resistor area 102 are located at the same interconnect level as that of conductive interconnect 18' within the second dielectric material 14'.

Figure 2A:
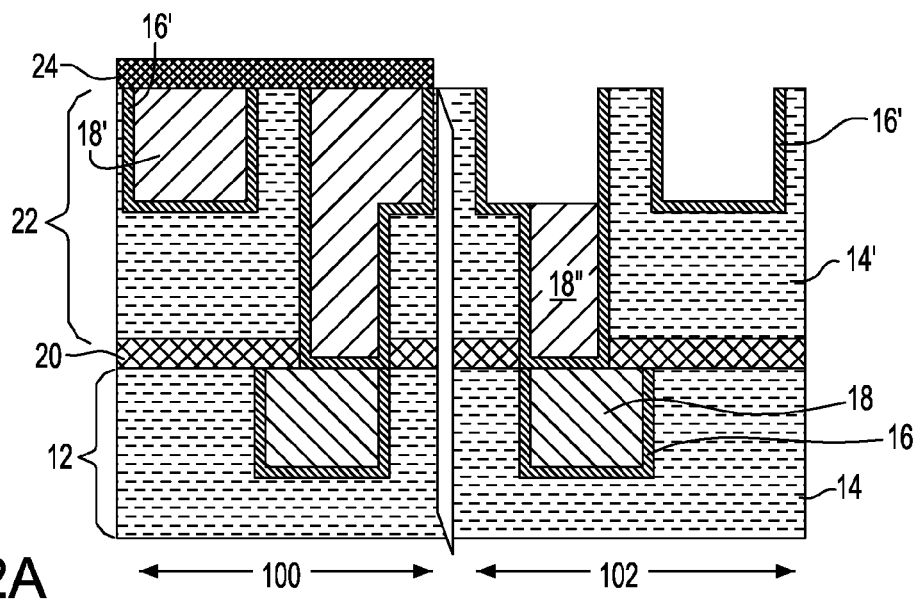
FIGS. 2A-2B are pictorial representations (through cross sectional views) depicting the basic processing steps employed in a second embodiment of the present application.
Figure 2B:
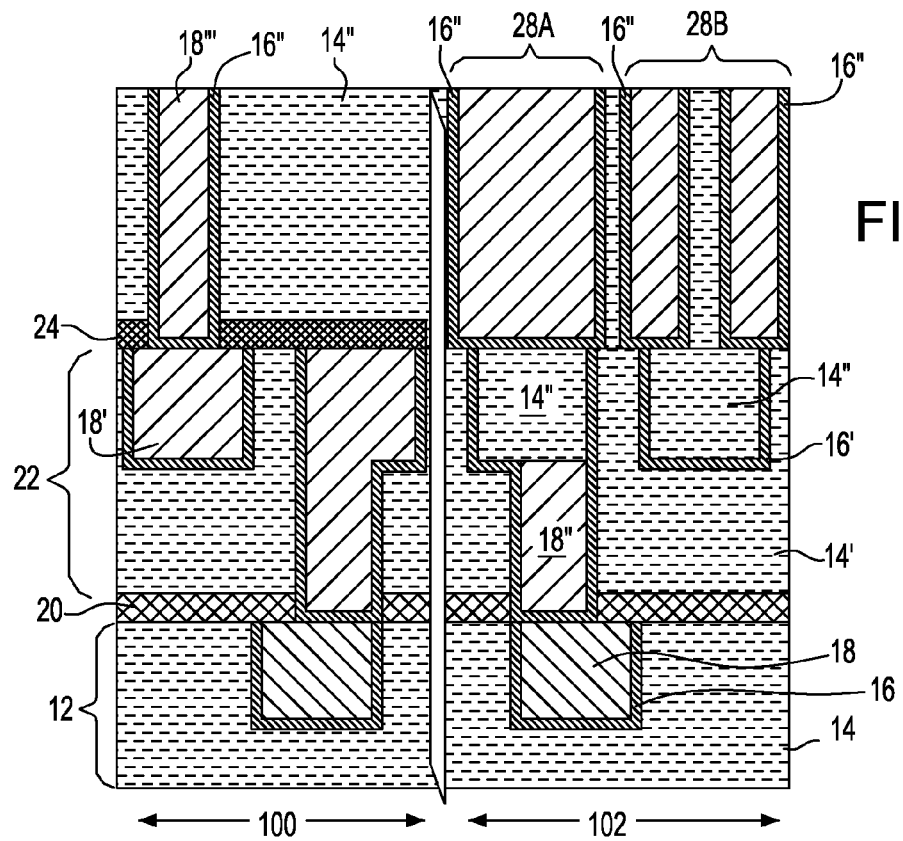

Reference is now made to FIGS. 2A and 2B which illustrate a second embodiment of the present invention. The second embodiment of the present invention is essentially the same as the first embodiment described above, except that the conductive material in the conductive interconnects 18" located in the resistor areas 102 is only partially removed.

In accordance with the second embodiment of the present invention, the structure shown in FIG. 1B is first formed utilizing the materials and processing steps mentioned above. After providing the structure shown in FIG. 1B, a timed etching process is used to partially remove the conductive material from the conductive interconnects 18" in the resistor area 102. The timed etching process provides the structure shown, for example, in FIG. 2A.

After providing the structure shown in FIG. 2A, the processing steps mentioned above in connection with FIGS. 1D and 1E are performed providing the structure shown in FIG. 2B. It is noted that the resultant structure is similar to that shown in FIG. 1E except that some conductive material remains in the via of the second interconnect level 22 in the resistor area 102.

Reference is now made to FIGS. 3A-3E which illustrate a third embodiment of the present application. The third embodiment is an extension of the second embodiment in that in the third embodiment a second resistor area 102' is defined. In the third embodiment, the structure shown in FIG. 2A is first provided as described above. After the timed etching step that partially removes conductive material from resistor area 102 and 102', a planarizing material 30 is formed providing the structure shown in FIG. 3A. The planarizing material 30 comprises an antireflective coating (ARC) and/or a doped or undoped silicate glass. The planarizing material 30 is formed by a conventional deposition process including, for example, spin-on coating.

Figure 3A:
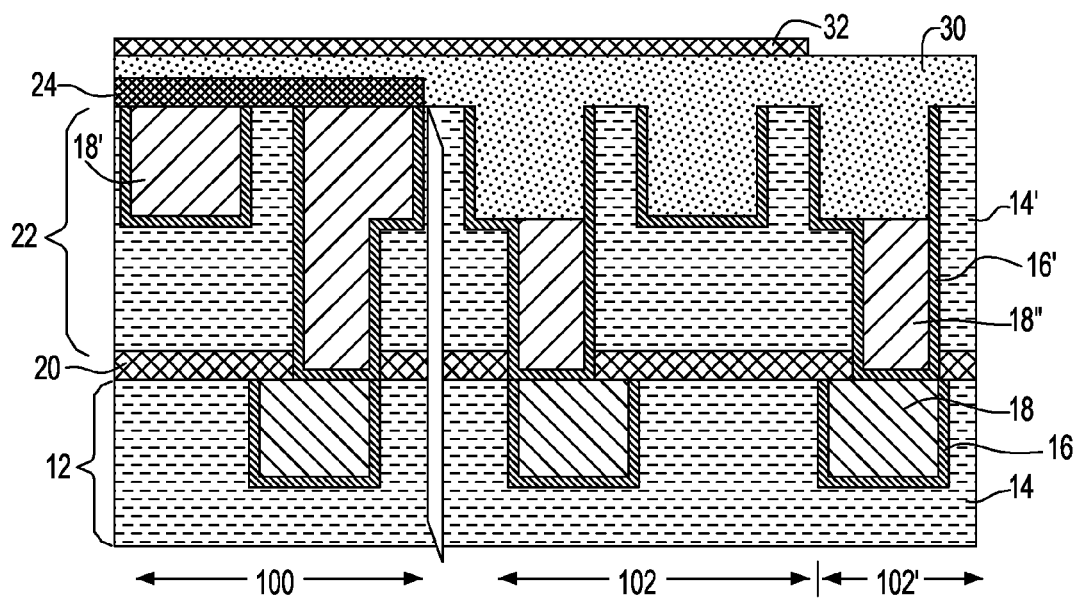
FIGS. 3A-3E are pictorial representations (through cross sectional views) depicting the basic processing steps employed in a third embodiment of the present application.

After deposition of the planarizing material 30, an oxide 32 is formed atop portions of the planarizing material 30 as is also shown in FIG. 3A. Specifically, the oxide 32 protects the first resistor area 102, during processing of the second resistor area 102'. The oxide 32 is formed by deposition, lithography and etching. A low temperature (less than 500° C.) deposition process is typically used in forming the oxide 32. The oxide 32 has a thickness that is typically from about 5 to about 100 nm, with a thickness from about 15 to about 50 nm being even more typical.

Figure 3B:
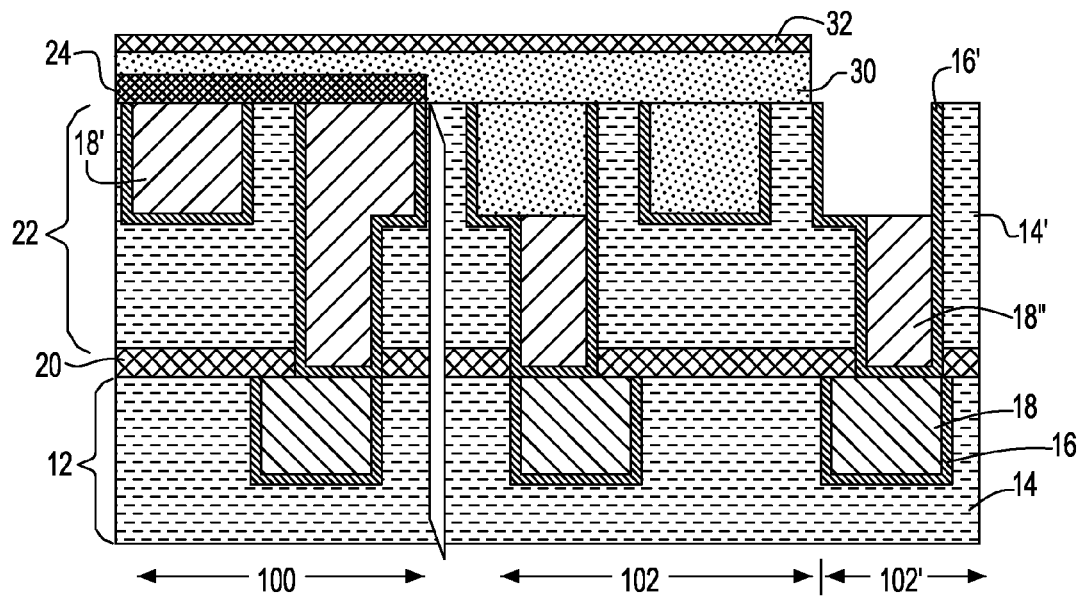

FIG. 3B shows the structure after the planarizing material 30 has been removed from the second resistor area 102'. Any conventional stripping process such as, for example, can be used to remove the exposed planarizing material 30, which is not protected by the oxide 32, from the second resistor area 102'.

Figure 3C:
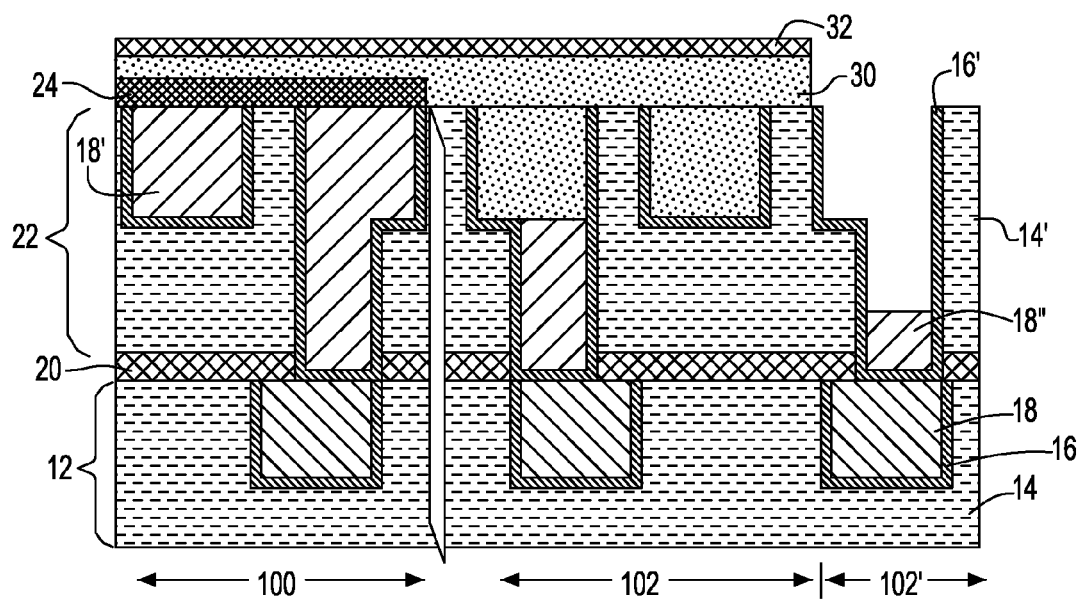

FIG. 3C shows the structure after the conductive material within the conductive interconnect 18″ of the second resistor area 102′ has been partially removed utilizing a second timed etching process as described above.

Figure 3D:
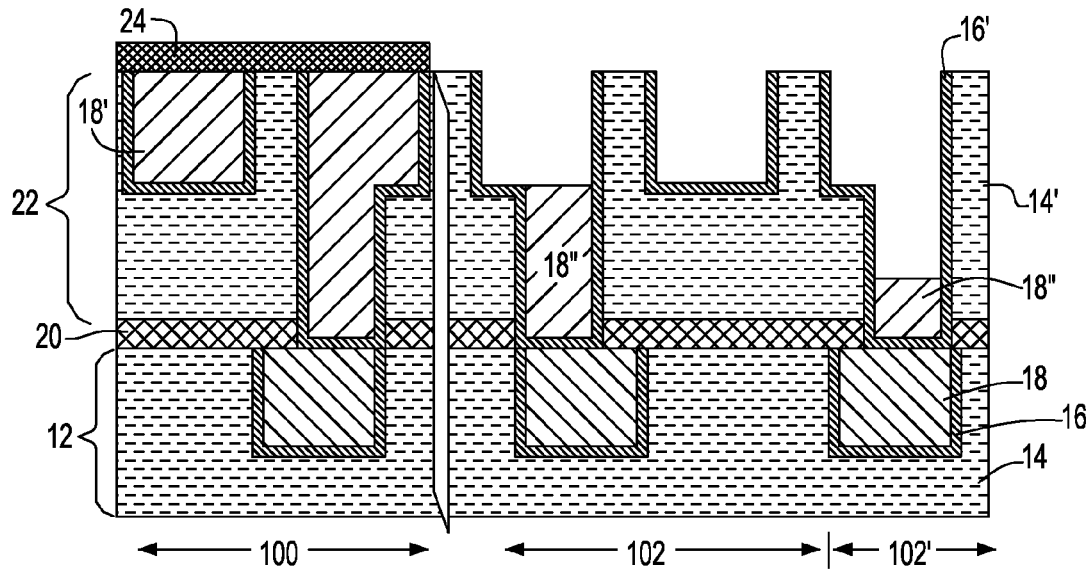
Figure 3E:
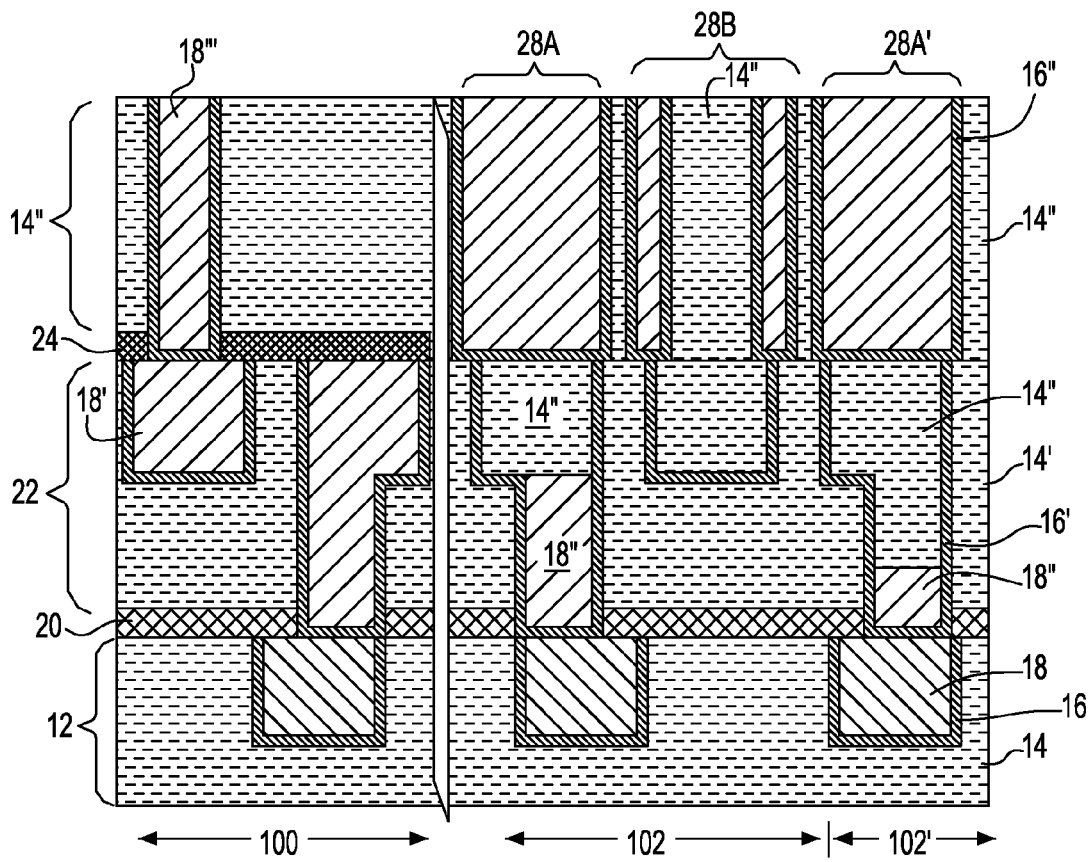

After providing the structure shown in FIG. 3C, the oxide 32 and the planarizing material 30 are removed utilizing conventional etching processes well known in the art to provide the structure shown in FIG. 3D. FIG. 3E shows the structure after formation of conductive interconnect 18′″ and resistor circuits 28A, 28B and 28A′.

Figure 4:
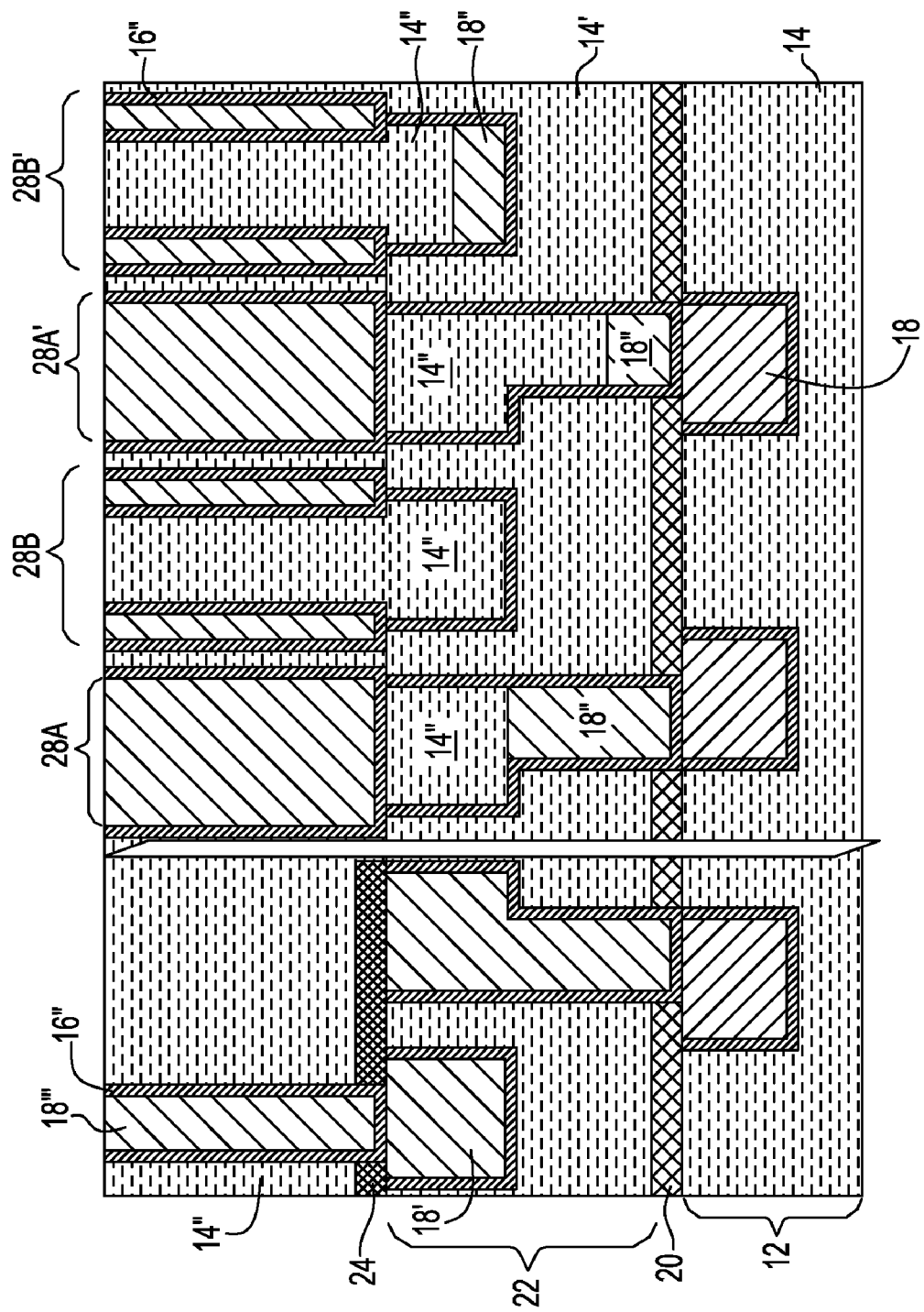
FIG. 4 is a pictorial representation (through a cross sectional view) depicting a fourth embodiment of the present application.

FIG. 4 illustrates yet another structure that can be fabricated utilizing the processing mentioned above in FIGS. 3A-3E. In this structure, a resistor circuit 28B′ is also formed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising a dielectric material including a conductive interconnect located within an interconnect area of said dielectric material and a resistor located along wall portions of a lithographically defined feature within a resistor area of said dielectric material, but not on an upper surface of said dielectric material, wherein said resistor is located at the same interconnect level as that of the conductive interconnect, and said resistor within said resistor area is laterally separated from said conductive interconnect within said interconnect area by a portion of said dielectric material, and wherein at least another dielectric material is present in an upper portion of the lithographically defined feature in said resistor area, and wherein a conductive material is present in a lower portion of the lithographically defined feature.

2. The interconnect structure of claim 1 wherein said dielectric material is an inorganic or organic dielectric that is optionally porous.

3. The interconnect structure of claim 1 wherein said resistor comprises a diffusion barrier material.

4. The interconnect structure of claim 3 wherein said diffusion barrier material comprises Ta, TaN, Ti, TiN, Ru, RuN, RuTa, RuTaN, W or WN.

5. The interconnect structure of claim 1 wherein said resistor is located within a dual damascene line/via structure.

6. The interconnect structure of claim 1 wherein said resistor is located within a single damascene line.

7. An interconnect structure comprising, from bottom to top:
a first interconnect level including a first conductive interconnect embedded within a first dielectric material;
a second interconnect level comprising a second dielectric material including a conductive interconnect located within an interconnect area of said second dielectric material and a resistor located along wall portions of a lithographically defined feature within a resistor area of said second dielectric material, but not on an upper surface of said second dielectric material, wherein said resistor is located at the same interconnect level as that of the conductive interconnect, and said resistor within resistor area is laterally separated from said conductive interconnect within said interconnect area by a portion of said second dielectric material; and
a third interconnect level including a third conductive interconnect embedded within a third dielectric material, wherein portions of the third dielectric material are at least partially present within said lithographically defined feature of said resistor area.

8. The interconnect structure of claim 7 wherein said first, second and third dielectric materials are the same or different and comprise an inorganic or organic dielectric that is optionally porous.

9. The interconnect structure of claim 7 wherein said resistor comprises a diffusion barrier material.

10. The interconnect structure of claim 9 wherein said diffusion barrier material comprises Ta, TaN, Ti, TiN, Ru, RuN, RuTa, RuTaN, W or WN.

11. The interconnect structure of claim 7 wherein said resistor is located within a dual damascene line/via structure which is completely or partially filled said third dielectric material.

12. The interconnect structure of claim 7 wherein said resistor is located within a dual damascene line/via structure which is completely filled with said third dielectric material and a conductive material.

13. The interconnect structure of claim 7 wherein said resistor is located within a single damascene line that is completely or partially filled with said third dielectric material.

14. A method of fabricating an interconnect structure comprising:
providing an interconnect structure that comprises a lower dielectric material having at least one conductive interconnect located within an interconnect area of said lower dielectric material and at least one other conductive interconnect located within a lithographically defined feature within a resistor area of said lower dielectric material;
selectively removing at least some of the at least one other conductive interconnect from resistor area, while leaving a diffusion barrier material on wall portions of said lithographically defined feature within said resistor area, said diffusion barrier material forming a resistive element;
depositing an upper dielectric material on said lower dielectric material in both said interconnect area and said resistor area, said upper dielectric material fills said lithographically defined feature within said resistor area; and
forming an upper conductive interconnect in said upper dielectric material in both said interconnect area and said resistor area, wherein said resistive element within said resistor area is laterally separated from said conductive interconnect within said interconnect area by a portion of said lower dielectric material.

15. The method of claim 14 wherein said diffusion barrier material comprises Ta, TaN, Ti, TiN, Ru, RuN, RuTa, RuTaN, W or WN.

16. The method of claim 14 wherein said diffusion barrier material is located within a dual damascene line/via structure which is completely or partially filled with said upper dielectric material.

17. The method of claim 14 wherein said diffusion barrier material is located within a dual damascene line/via structure which is completely filled with said upper dielectric material and a conductive material.

18. The method of claim 14 wherein said diffusion barrier material is located within a single damascene line that is completely or partially filled with said upper dielectric material.

* * * * *